(12) United States Patent
Yamamoto et al.

(10) Patent No.: US 10,415,118 B2
(45) Date of Patent: *Sep. 17, 2019

(54) ALUMINUM ALLOY PLATE

(71) Applicant: UACJ Corporation, Tokyo (JP)

(72) Inventors: Yusuke Yamamoto, Tokyo (JP); Mineo Asano, Tokyo (JP)

(73) Assignee: UACJ Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/407,275

(22) PCT Filed: Jun. 6, 2013

(86) PCT No.: PCT/JP2013/065704
§ 371 (c)(1),
(2) Date: Dec. 11, 2014

(87) PCT Pub. No.: WO2013/187308
PCT Pub. Date: Dec. 19, 2013

(65) Prior Publication Data
US 2015/0144493 A1 May 28, 2015

(30) Foreign Application Priority Data

Jun. 15, 2012 (JP) .................. 2012-135622
Oct. 30, 2012 (JP) .................. 2012-239301

(51) Int. Cl.
*C22C 21/06* (2006.01)
*C22C 21/00* (2006.01)
(Continued)

(52) U.S. Cl.
CPC .............. *C22C 21/06* (2013.01); *B22D 21/04* (2013.01); *B62D 29/008* (2013.01); *C22C 21/00* (2013.01);
(Continued)

(58) Field of Classification Search
CPC .......... C22C 21/00; C22C 21/06; C22C 21/08
(Continued)

(56) References Cited

U.S. PATENT DOCUMENTS 4,715,901 A 12/1987 Granger
2008/0289731 A1* 11/2008 Uesugi et al. ............... 148/692

FOREIGN PATENT DOCUMENTS

CN 101959625 1/2011
CN 102191415 9/2011
(Continued)

OTHER PUBLICATIONS

English language machine translation of JPH09143602 to Moriyama et al. Generated Aug. 17, 2015.*
(Continued)

*Primary Examiner* — Brian D Walck
(74) *Attorney, Agent, or Firm* — Westman, Champlin & Koehler, P.A.

(57) ABSTRACT

An aluminum alloy plate includes peritectic elements and Mg. Wherein plate thickness of the plate is represented as t (mm), a range within ±0.01×t from t/2 is represented as a central portion, a range within ±0.01×t from t/4 is represented as a quarter portion, and a range within 0.02×t from a top surface in the plate thickness direction is represented as a superficial portion, concentration of the peritectic elements is such that a concentration difference between in the central portion and in the quarter portion, and a concentration difference between in the central portion and in the superficial portion are 0.04% (mass %) or less. In addition, concentration of the Mg is such that a concentration difference between in the central portion and in the quarter portion, and a concentration difference between in the central portion and in the superficial portion of the plate thickness are 0.4% or less.

6 Claims, 1 Drawing Sheet

(51) Int. Cl.
    *C22C 21/08*     (2006.01)
    *B22D 21/04*     (2006.01)
    *C22F 1/00*     (2006.01)
    *C22F 1/04*     (2006.01)
    *B62D 29/00*     (2006.01)
    *H05K 5/04*     (2006.01)
    *B22D 27/02*     (2006.01)

(52) U.S. Cl.
    CPC ............... *C22C 21/08* (2013.01); *C22F 1/00* (2013.01); *C22F 1/04* (2013.01); *H05K 5/04* (2013.01); *B22D 27/02* (2013.01)

(58) Field of Classification Search
    USPC .......... 148/437–440; 420/532–536, 542–547
    See application file for complete search history.

(56) References Cited

FOREIGN PATENT DOCUMENTS

| | | | |
|---|---|---|---|
| CN | 102266924 | A | 12/2011 |
| DE | 2520554 | A1 | 11/1976 |
| EP | 2034035 | A1 | 11/2009 |
| EP | 2263811 | A1 | 12/2010 |
| JP | H09143602 | A | 6/1997 |
| JP | 2000273563 | A | 10/2000 |
| JP | 2001040444 | A | 2/2001 |
| JP | 2005186119 | A | 7/2005 |
| JP | 2006052436 | A | 2/2006 |
| JP | 2009256782 | A | 11/2009 |
| JP | 2011179094 | A | 9/2011 |

OTHER PUBLICATIONS

White et al. "Reverberatory and Stack Furnaces," Casting, vol. 15, ASM Handbook, ASM International, 2008, p. 160-170.*
International Search Report for corresponding International Application No. PCT/JP2013/065704, filed Jun. 6, 2013.
Japanese Office Action for corresponding Japanese Patent Application No. 2013-549648, dated Apr. 15, 2014.
International Preliminary Report on Patentability and Written Opinion dated Dec. 24, 2014, from International Application No. PCT/JP2013/065704 (7 pages).
Chinese Office Action in the counterpart Chinese Application 201380029921.4, dated Nov. 16, 2015 (11 pages).
Extended European Search Report dated Apr. 29, 2016 for corresponding European Application No. 13804780.8.
Granger, Douglas A.; Jensen, Craig L.:"Role of ingot strcutre in structural streaking", Light Metals, Jan. 1, 1984 (Jan. 1, 1984), pp. 1249-1263.
Nadella et al.: "Macrosegregation in direct-chill casting of aluminium alloys", Progress in Materials Science, Pregamon Press, GB, vol. 53, No. 3, Oct. 26, 2007 (Oct. 26, 2007), pp. 421-480.
Chinese Office Action dated Sep. 8, 2016 for Chinese Application No. CN201380029921.4.
European Office Action dated Mar. 21, 2017 for European Patent Application No. 13804780.8.
European Office Action dated Feb. 9, 2018 for European Patent Application No. 13804780.8.
Chinese Office Action in the counterpart Chinese Application No. 201710580645.0, dated Aug. 2, 2018, and English translation.
European Office Action in corresponding European patent application No. 13804780.8, dated Apr. 25, 2019.

* cited by examiner

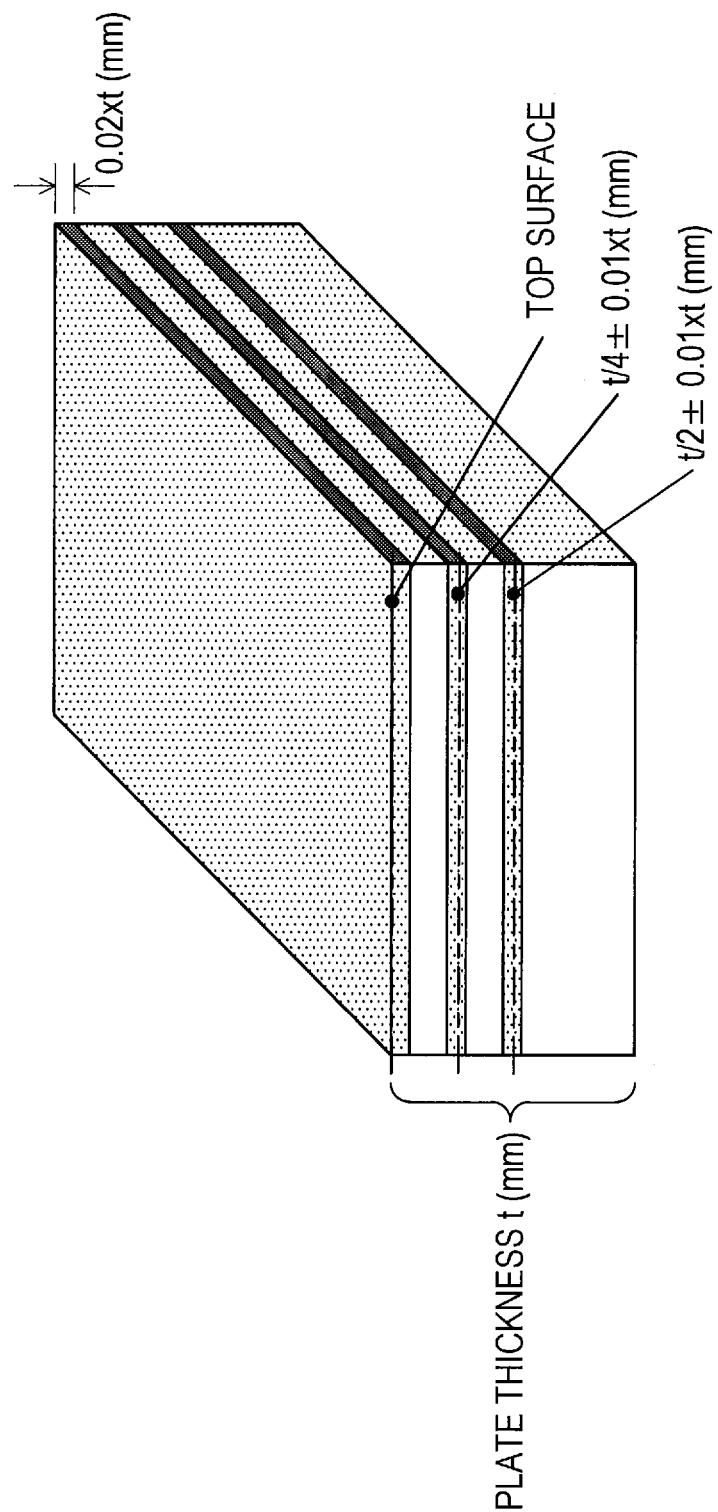

ALUMINUM ALLOY PLATE

CROSS-REFERENCE TO RELATED APPLICATION

This Application is a Section 371 National Stage Application of International Application No. PCT/JP2013/065704, filed Jun. 6, 2013 and published as WO 2013/187308 on Dec. 19, 2013, in Japanese, the contents of which are hereby incorporated by reference in their entirety.

The present application claims the benefit of Japanese Patent Application No. 2012-135622, filed on Jun. 15, 2012, and Japanese Patent Application No. 2012-239301, filed on Oct. 30, 2012 in Japan Patent Office, the entire disclosures of which are incorporated herein by reference.

TECHNICAL FIELD

The present invention relates to an aluminum alloy plate in which strip-like line patterns are not produced in a central portion of a thickness of the plate after anodic oxidation. The aluminum alloy plate exhibits excellent quality in a cross-sectional surface of the plate after anodic oxidation.

BACKGROUND ART

Recently, usage of aluminum alloy plates has been increasing for interior parts of automobiles and outer panels of home electric appliances. In either case, the aluminum alloy plates are required to have excellent surface quality in finished products. For example, when the plates are used for outer panels of home electric appliances, the plates are required not to have line patterns on the plate surfaces after anodic oxidation is performed. Various studies have been made in order to inhibit line patterns, and some methods have been suggested wherein chemical compositions, diameters of crystal grains in finished plates, sizes of deposits, distribution densities, and so on are controlled.

On the other hand, as the usage of aluminum alloy plates has become diversified, not only a plate surface, but also a cross-sectional surface of the plates is required to have good appearances. Specifically, the cross-sectional surface of the plates is required not to have line patterns after anodic oxidation is performed. In order to solve this problem, a method has been proposed so as to equalize the sizes of crystal grains in a cross-sectional surface of the plates. However, this method is not always effective in inhibiting the production of strip-like line patterns and therefore cannot be a reliable solution.

PRIOR ART DOCUMENTS

Patent Documents

Patent Document 1: Publication of Unexamined Japanese Patent Publication No. 2000-273563
Patent Document 2: Publication of Unexamined Japanese Patent Publication No. 2006-52436
Patent Document 3: Publication of Unexamined Japanese Patent Publication No. 2001-40444

SUMMARY OF THE INVENTION

Problems to be Solved by the Invention

In order to solve the problem of the strip-like line patterns being produced in a cross-sectional surface of an aluminum alloy plate after anodic oxidation, the inventors conducted various experiments and studies. As a result, the inventors have found out that, in an aluminum alloy containing peritectic elements, which show peritectic reaction to aluminum, and Mg, which shows eutectic reaction to aluminum, the existing state of the peritectic elements and Mg in solid solution state influences the production of strip-like line patterns in a cross-sectional surface of a plate after anodic oxidation.

The present invention is made based on the above-described finding. One of the aspects of the present invention preferably provides an aluminum alloy plate having excellent quality in a cross-sectional surface without strip-like line patterns being produced in a central portion of a thickness of the cross-sectional surface of the plate after anodic oxidation.

Means for Solving the Problems

A first aspect of the present invention provides an aluminum alloy plate having an anodically-oxidized coating formed at least on a cross-sectional surface of the plate, which is a cross-sectional portion in a plate thickness direction. The plate at least comprises peritectic elements that show peritectic reaction with respect to aluminum, and Mg that shows eutectic reaction with respect to aluminum. Wherein the plate thickness is represented as t (mm), a range within ±0.01×t (mm) from t/2 is represented as a central portion, a range within ±0.01×t (mm) from t/4 is represented as a quarter portion, and a range within 0.02×t (mm) from a top surface in the plate thickness direction is represented as a superficial portion, concentration of the peritectic elements in solid solution state in the plate thickness direction of the aluminum alloy plate is such that a concentration difference between in the central portion and in the quarter portion, and a concentration difference between in the central portion and in the superficial portion are 0.04% (mass %, same applies hereinafter) or less. In addition, concentration of Mg in solid solution state in the plate thickness direction of the aluminum alloy plate is such that a concentration difference between in the central portion and in the quarter portion, and a concentration difference between in the central portion and in the superficial portion are 0.4% or less.

The aluminum alloy plate according to a second aspect of the present invention, having excellent quality in a cross-sectional surface after anodic oxidation, comprises, as set forth in the first aspect, one or two kinds of the peritectic elements selected from 0.001%-0.1% of Ti, and 0.0001%-0.4% of Cr.

The aluminum alloy plate according to a third aspect of the present invention, having excellent quality in a cross-sectional surface after anodic oxidation, comprises, as set forth in the first or second aspects, 1.0%-6.0% of Mg.

The aluminum alloy plate according to a fourth aspect of the present invention, having excellent quality in a cross-sectional surface after anodic oxidation, comprises, as set forth in one of the aspects 1 to 3, one, two, or more kinds of elements selected from 0.5% or less of Cu, 0.5% or less of Mn, 0.4% or less of Fe and 0.3% or less of Si in addition to the peritectic elements and Mg. Moreover, the remainder of the aluminum alloy plate is made of Al and inevitable impurities.

In the aluminum alloy plate according to a fifth aspect of the present invention, having excellent quality in a cross-sectional surface after anodic oxidation, the plate thickness of the aluminum alloy plate is 0.3 mm or larger, as set forth in one of aspects 1 to 4.

Effects of the Invention

One of the aspects of the present invention provides an aluminum alloy plate wherein strip-like line patterns are not produced in the central portion of the plate thickness of a cross-sectional surface after anodic oxidation. The aluminum alloy plate exhibits excellent quality in a cross-sectional surface of the plate after anodic oxidation. It is to be noted that the cross-sectional surface (the cross-sectional surface portion in the plate thickness direction) may be a cross-sectional surface in a direction parallel to the rolling direction, in a direction perpendicular to the rolling direction, or in any other direction, and that the effect according to one of the aspects of the present invention can be still achieved in such surfaces.

BRIEF DESCRIPTION OF THE DRAWINGS

FIG. 1 is an explanatory diagram showing a central portion, a quarter portion and a superficial portion of a plate thickness according to the present invention.

MODE FOR CARRYING OUT THE INVENTION

In the present embodiment, concentration of peritectic elements in solid solution state in a direction of a plate thickness of an aluminum alloy plate is such that a concentration difference between in a central portion of the plate thickness and in a quarter portion of the plate thickness, and the concentration difference between in the central portion and in a superficial portion of the plate thickness, are 0.04% or less. Moreover, the concentration of Mg in solid solution state in the direction of the plate thickness of the aluminum alloy plate is such that a concentration difference between in the central portion and in the quarter portion, and a concentration difference between in the central portion and the superficial portion are 0.4% or less. When an aluminum alloy plate having such characteristics is anodically-treated, strip-like line patterns are not produced in the central portion of the plate thickness of a cross-sectional surface of the plate, and an anodically-treated aluminum alloy plate with excellent quality in a cross-sectional surface can be achieved. Having excellent quality in a cross-sectional surface means, for example, a state wherein no strip-like line patterns is produced in the central portion of the plate thickness of a cross-sectional surface of the plate.

The above-mentioned central portion, quarter portion, and superficial portion of the plate thickness are now explained. In a case wherein the plate thickness is represented as t (mm), as shown in FIG. 1, the central portion indicates a range within ±0.01×t (mm) from t/2, the quarter portion indicates a range within ±0.01×t (mm) from t/4, and the superficial portion indicates a range within 0.02×t (mm) from the top surface in the plate thickness direction.

In the concentration of peritectic elements in solid solution state in the direction of the plate thickness of an aluminum alloy plate, if the concentration difference between in the central portion and in the quarter portion, and the concentration difference between in the central portion and in the superficial portion exceed 0.04%, or in the concentration of Mg in solid solution state in the direction of the plate thickness of the aluminum alloy plate, the concentration difference between in the central portion and in the quarter portion, and the concentration difference between in the central portion and in the superficial portion exceed 0.4%, the thickness of strip-like line patterns produced in the central portion of the plate thickness of a cross-sectional surface of the plate becomes, in some cases, approximately 0.05-0.15×t (mm), wherein the plate thickness is represented as t (mm). In this case, after anodic oxidation is performed, line patterns can be easily found by visual observation. That is, excellent surface quality cannot be always achieved. The plate thickness t may be in any dimension as long as a cross-sectional surface after anodic oxidation can be visually checked, and is not specifically limited. However, the thickness t is preferably 0.3 mm or larger, more preferably 0.5 mm or larger.

After anodic oxidation, peritectic elements and Mg are taken into an anodic oxide coating while both elements are in solid solution state. In a case wherein an aluminum alloy plate, having the characteristics according to the present embodiment, is anodically-treated, even in the anodically-treated aluminum alloy plate, concentration of the peritectic elements in solid solution state that are taken into the anodic oxide coating becomes such that a concentration difference between in the central portion and in the quarter portion, and a concentration difference between in the central portion and in the superficial portion become 0.02% or less. Moreover, concentration of Mg in solid solution state that is taken into the anodic oxide coating becomes such that a concentration difference between in the central portion and in the quarter portion, and a concentration difference between in the central portion and in the superficial portion become 0.08% or less.

In an aluminum alloy plate, if some areas, wherein the concentration of Mg in solid solution state is high, are unevenly distributed, because of the concentration difference between these areas and surrounding areas, the patterns will appear in the anodic oxide coating after anodic oxidation. This is thought to be caused by Mg being taken into the anodic oxide coating while Mg is in solid solution state. Therefore, if the high concentration areas are formed into strip-like shapes, these areas give appearances of line patterns.

The concentration of peritectic elements and Mg in solid solution states are analyzed by way of point analysis, wherein an electron micro-analyzer (EPMA) is used so as to irradiate an electron beam, having 1-5 μm in diameter, and to measure a fluorescent X-ray produced by the irradiation. In this way, the concentration in the central portion, the quarter portion, and the superficial portion of the plate thickness are respectively obtained.

The peritectic elements preferably include Ti and Cr.
Ti: 0.001%-0.1%

Ti serves to inhibit a cast structure from being coarsened. Preferable content is 0.001%-0.1%. In a case wherein Ti content is 0.001% or more, the effect of inhibiting the coarsening can be significantly large. In a case wherein Ti content is 0.1% or less, generation of coarse intermetallic compounds is inhibited, and line patterns, produced in a cross-sectional surface of a plate after anodic oxidation, become extremely hard to be seen. In a case wherein the content is less than 0.001%, the function to inhibit the coarsening of the cast structure may become insufficient in some cases. In a case wherein the content exceeds 0.1%, coarse intermetallic compounds are generated, as a result of which line patterns may be produced, in some cases, after anodic oxidation.

Cr: 0.0001%-0.4%

Cr serves to increase strength of an aluminum alloy plate and to refine crystal grains. Preferable content is 0.0001%-0.4%. In a case wherein Cr content is 0.0001% or more, at least one of the effect of increasing the strength of an aluminum alloy plate and the effect of refining crystal grains can be significantly large. In a case wherein Cr content is 0.4% or less, generation of coarse intermetallic compounds is inhibited, and line patterns produced in a cross-sectional surface of a plate after anodic oxidation become extremely hard to see. In a case wherein the content is less than 0.0001%, metal with high purity needs to be used in some cases. Using such metal can be costly and cannot be realistic for an industrial material. Therefore, in order to sufficiently achieve the effect for increasing the strength of an aluminum alloy plate and the effect for refining crystal grains, the content is preferably 0.0001% or more. In a case wherein the content exceeds 0.4%, coarse intermetallic compounds may be generated, as a result of which line patterns may be produced, in some cases, after anodic oxidation.

Additive elements, other than peritectic elements, are now explained.

Mg: 1.0%-6.0%

Mg serves to increase strength of an aluminum alloy plate. Preferable content is 1.0%-6.0%. In a case wherein the Mg content is 1.0% or more, the effect for increasing strength of an aluminum alloy plate can be large. In a case wherein the content is 6.0% or less, a property that allows preferable rolling can be achieved. In a case wherein the content is less than 1.0%, the effect for increasing the strength may not be sufficiently achieved in some cases. In a case wherein the content exceeds 6.0%, cracks may be more easily produced in a hot-rolling process, and the rolling may become difficult in some cases.

Cu: 0.5% or Less

Cu serves to increase strength of an aluminum alloy plate and to achieve a uniform color shade in the entire coating after anodic oxidation. Preferable content is 0.5% or less. In a case wherein Cu content is 0.5% or less, line patterns, produced in a cross-sectional surface of a plate after anodic oxidation, may become extremely hard to see, and the color shade in the entire coating after anodic oxidation may become remarkably even. In a case wherein the content exceeds 0.5%, Al—Cu deposit is formed, as a result of which line patterns and opacity in the coating may be produced, in some cases, due to the intermetallic compounds.

It is to be noted that "0.5% or less" mentioned herein does not include 0%, however indicates from more than 0% to equal to or less than 0.5%. The same applies with respect to Mn, Fe, and Si, to be explained below.

Mn: 0.5% or Less

Mn serves to increase strength of an aluminum alloy plate and to refine crystal grains. Preferable content is 0.5% or less. In a case wherein Mn content is 0.5% or less, line patterns, produced in a cross-sectional surface of a plate after anodic oxidation, may become extremely hard to see, and the color shade in the entire coating after anodic oxidation may become remarkably even. In a case wherein the content exceeds 0.5%, Al—Mn—Si crystallized product and deposit are formed, as a result of which line patterns and opacity in the coating may be produced in some cases, due to the intermetallic compounds.

Fe: 0.4% or Less

Fe serves to increase strength of an aluminum alloy plate and to refine crystal grains. Preferable content is 0.4% or less. In a case wherein Fe content is 0.4% or less, line patterns, produced in a cross-sectional surface of a plate after anodic oxidation, may become extremely hard to see, and the color shade in the entire coating after anodic oxidation may become remarkably even. In a case wherein the content exceeds 0.4%, Al—Fe—Si or Al—Fe crystallized product and deposit are formed, as a result of which line patterns and opacity in the coating in some cases, due to the intermetallic compounds.

Si: 0.3% or Less

Si serves to increase strength of an aluminum alloy plate and to refine crystal grains. Preferable content is 0.3% or less. In a case wherein Si content is 0.3% or less, line patterns, produced in a cross-sectional surface of a plate after anodic oxidation, may become extremely hard to be seen, and the color shade in the entire coating after anodic oxidation may become remarkably even. In a case wherein the content exceeds 0.3%, Al—Fe—Si crystallized product and Mg—Si deposit are formed, as a result of which line patterns and opacity in the coating may be produced, in some cases, due to the intermetallic compounds.

It is to be noted that the inevitable impurities may contain, for example, Zn elements and the like. Preferable content of inevitable impurities is 0.25% or less.

The following explains a method for manufacturing an aluminum alloy plate according to the present embodiment. The aluminum alloy plate according to the present embodiment is manufactured by providing an ingot, made by common DC casting, with a conventional homogenization process, a hot rolling process, and a cool rolling process. A preferable method may be such that ingot casting is performed by producing a flow in molten metal during casting. This method can effectively inhibit non-uniformity in a chemical composition produced inside a casting mold. The method of producing a flow in molten metal inside a casting mold can be, for example, mechanical stirring by using stirring blades, electromagnetic stirring by using eddy currents, magnetic stirring by using Lorentz force, ultrasonic stirring by using ultrasonic force, and so on.

In any of the stirring methods, the flow speed is preferably in a range of 0.1-5 m/s. In a case wherein the flow speed of molten metal is in the range of 0.1-5 m/s, the effect of inhibiting non-uniformity in a chemical composition can be particularly large. In a case wherein the flow speed of molten metal is too slow (that is, the flow speed of the molten metal is in a range slower than 0.1 m/s), the effect of inhibiting the non-uniformity in the chemical composition, produced inside of a casting mold, may become small in some cases. On the other hand, in a case wherein the flow speed of molten metal is too fast (that is, the flow speed of the molten metal is in a range faster than 5 m/s), an anodically-oxidized coating, made on the surface of molten metal, may be mixed into the molten metal.

The flow speed of molten metal may be controlled by adjusting the temperature of the molten metal (viscosity of the molten metal) and stirring conditions. For example, the higher the molten metal temperature is, the lower the molten metal viscosity may become, whereas the lower the molten metal temperature is, the higher the molten metal viscosity may become. Therefore, in the present embodiment, in order to obtain desired flow speed, the molten metal temperature (the molten metal viscosity) may be controlled based on a value detected from the molten metal temperature (the molten metal viscosity). It is to be noted that the molten metal viscosity may be different depending on the chemical composition of molten metal. For example, even at an equivalent molten metal temperature, viscosity may be different if the chemical composition is different. Therefore, the appropriate molten metal temperature suitable for the chemical composition needs to be set.

The stirring conditions may include, in mechanical stirring, rotational speed of stirring blades, number and shape of the stirring blades, and so on in one example. In electromagnetic stirring and magnetic stirring, the stirring conditions may include strength of magnetic field to be produced and so on. In ultrasonic stirring, the stirring conditions may include vibration frequency, strength (sound pressure), and so on in one example.

The above-described stirring method (in other words, a method of controlling the flow speed of molten metal inside of a casting mold) enables to achieve an ingot having uniform chemical composition in a cross-sectional surface of the ingot. As a result, in a cross-sectional surface of a plate manufactured by using the obtained ingot, the chemical composition is also in a uniform manner. That is to say, usage of the above-described stirring method enables to manufacture aluminum alloy plates having the properties according to the present embodiment. In other words, in the present embodiment, the above-described stirring method is used in order to achieve aluminum alloy plates having desired properties.

A point analysis is conducted with respect to the obtained aluminum alloy plate wherein concentration is measured from a fluorescence X-ray produced by irradiation of an electron beam by using EPMA as described above. From this analysis, the concentration of peritectic elements and Mg in the central portion, the quarter portion and the superficial portion of the plate thickness are obtained. Subsequently, it is checked whether or not an aluminum alloy plate, having the above-described properties according to the present embodiment, is achieved. Then, the plate is given for the anodic oxidation process.

EMBODIMENT

Hereinafter, embodiments according to the present invention are explained in comparison with comparative examples. These embodiments are illustrative and the present invention is not limited to these embodiments.

Embodiment 1, Comparative Example 1

Aluminum alloys, having compositions shown in Table 1, were cast by way of DC casting so as to make ingots with cross-sectional dimensions of 480 mm in thickness and 1500 mm in width. It is to be noted that casting was conducted under two different conditions: in one of which molten metal inside of a casting mold was stirred by using stirring blades during the casting; and in another of which no stirring was conducted.

Each of the obtained ingots was homogenized at the temperature of 550° C. for 10 hours, and then cooled down to a room temperature. The portions of the ingot, corresponding to the top, bottom, and side surfaces for rolling, were respectively milled 20 mm, then reheated up to 470° C. so as to initiate hot rolling, and rolled so as to be 8.0 mm thick. End temperature of the hot rolling was set to 300° C. Subsequently, cold rolling was conducted so that the ingot became 4.0 mm thick, and softening treatment was conducted at the temperature of 350° C. for one hour. The alloy compositions and the casting conditions of the obtained aluminum alloy plates (test materials) are shown in Table 2.

A sample with 20 mm width was cut out from the central portion of the width of each test material obtained as above, and treated by resin embedding and grinding so as to reveal the cross-sectional surfaces in a direction perpendicular to the rolling direction. By using EPMA, concentration of peritectic elements in solid solution state (concentration of Ti solid solution+concentration of Cr solid solution), and concentration of Mg in solid solution state in the central portion, the quarter portion, and the superficial portion of the plate thickness were measured. The results are respectively shown in Tables 3 and 5.

A sample with 400 mm width and 50 mm length was cut out from the central portion of the width of each aluminum alloy plate obtained as above. The sample was treated such that end surfaces thereof were cut by a milling cutter, and cross-sectional surfaces in a direction perpendicular to the rolling direction were roughened by shot blasting. Subsequently, chemical grinding by phosphoric acid and sulfuric acid was conducted, and anodic oxidation by sulfuric acid solution was conducted so as to form an anodic oxide coating with 10 μm thickness on the cross-sectional surfaces.

The anodically-oxidized materials obtained as above were visually checked whether strip-like line patterns were present or absent (presence or absence of production of the patterns) in the central portion of the plate thickness of the cross-sectional surfaces. Moreover, regarding the anodically-oxidized materials obtained as above, concentration of peritectic elements in solid solution state (concentration of Ti solid solution+concentration of Cr solid solution), and concentration of Mg in solid solution state in the central portion, the quarter portion and the superficial portion of the plate thickness of the cross-sectional surfaces were obtained. The results are respectively shown in Tables 4 and 6.

TABLE 1

| | CHEMICAL COMPOSITION (MASS %) | | | | | | | | |
|---|---|---|---|---|---|---|---|---|---|
| ALLOY | Si | Fe | Cu | Mn | Mg | Cr | Zn | Ti | Al |
| I | 0.056 | 0.352 | 0.009 | 0.005 | 2.654 | 0.195 | 0.005 | 0.035 | Bal. |
| II | 0.062 | 0.252 | 0.015 | 0.006 | 5.892 | 0.004 | 0.010 | 0.098 | Bal. |
| III | 0.107 | 0.162 | 0.081 | 0.053 | 1.221 | 0.0001 | 0.011 | 0.072 | Bal. |
| IV | 0.124 | 0.213 | 0.042 | 0.398 | 2.093 | 0.122 | 0.009 | 0.001 | Bal. |

TABLE 2

| | TEST MATERIAL | ALLOY | WITH/WITHOUT STIRRING OF MOLTEN METAL INSIDE CASTING MOLD |
|---|---|---|---|
| INVENTION | 11 | I | WITH |
| | 12 | II | WITH |
| | 13 | III | WITH |
| | 14 | IV | WITH |

TABLE 2-continued

| TEST MATERIAL | ALLOY | WITH/WITHOUT STIRRING OF MOLTEN METAL INSIDE CASTING MOLD |
|---|---|---|
| COMPARISON 15 | I | WITHOUT |
| 16 | II | WITHOUT |
| 17 | III | WITHOUT |
| 18 | IV | WITHOUT |

TABLE 3

| | CONCENTRATION OF PERITECTIC ELEMENTS IN SOLID SOLUTION STATE (BEFORE ANODIC OXIDATION) (MASS %) | | | | |
|---|---|---|---|---|---|
| TEST MATERIAL | CENTRAL PORTION | QUARTER PORTION | SUPERFICIAL PORTION | \|(CENTRAL PORTION) − (QUARTER PORTION)\| | \|(CENTRAL PORTION) − (SUPERFICIAL PORTION)\| |
| 11 | 0.217 | 0.249 | 0.232 | 0.032 | 0.015 |
| 12 | 0.103 | 0.114 | 0.107 | 0.011 | 0.004 |
| 13 | 0.068 | 0.075 | 0.073 | 0.007 | 0.005 |
| 14 | 0.114 | 0.127 | 0.124 | 0.013 | 0.010 |
| 15 | 0.302 | 0.225 | 0.234 | 0.077 | 0.068 |
| 16 | 0.175 | 0.103 | 0.108 | 0.072 | 0.067 |
| 17 | 0.132 | 0.065 | 0.068 | 0.067 | 0.064 |
| 18 | 0.151 | 0.103 | 0.105 | 0.048 | 0.046 |

TABLE 4

| | CONCENTRATION OF PERITECTIC ELEMENTS IN SOLID SOLUTION STATE (AFTER ANODIC OXIDATION) (MASS%) | | | | | PRESENCE/ABSENCE OF STRIP-LIKE LINE PATTERNS IN CENTRAL PORTION OF CROSS-SECTIONAL SURFACE |
|---|---|---|---|---|---|---|
| TEST MATERIAL | CENTRAL PORTION | QUARTER PORTION | SUPERFICIAL PORTION | [(CENTRAL PORTION)- (QUARTER PORTION)] | [(CENTRAL PORTION)- (SUPERFICIAL PORTION)] | |
| 11 | 0.121 | 0.139 | 0.135 | 0.018 | 0.014 | ABSENT |
| 12 | 0.058 | 0.064 | 0.059 | 0.006 | 0.001 | ABSENT |
| 13 | 0.039 | 0.042 | 0.042 | 0.003 | 0.003 | ABSENT |
| 14 | 0.062 | 0.072 | 0.069 | 0.010 | 0.007 | ABSENT |
| 15 | 0.168 | 0.125 | 0.130 | 0.043 | 0.038 | PRESENT |
| 16 | 0.096 | 0.058 | 0.061 | 0.038 | 0.035 | PRESENT |
| 17 | 0.073 | 0.036 | 0.038 | 0.037 | 0.036 | PRESENT |
| 18 | 0.084 | 0.058 | 0.059 | 0.026 | 0.025 | PRESENT |

TABLE 5

| | CONCENTRATION OF Mg IN SOLID SOLUTION STATE (BEFORE ANODIC OXIDATION) (MASS %) | | | | |
|---|---|---|---|---|---|
| TEST MATERIAL | CENTRAL PORTION | QUARTER PORTION | SUPERFICIAL PORTION | \|(CENTRAL PORTION) − (QUARTER PORTION)\| | \|(CENTRAL PORTION) − (SUPERFICIAL PORTION)\| |
| 11 | 2.672 | 2.604 | 2.711 | 0.068 | 0.039 |
| 12 | 5.932 | 6.143 | 5.791 | 0.211 | 0.141 |
| 13 | 1.266 | 1.182 | 1.286 | 0.084 | 0.020 |
| 14 | 2.167 | 2.001 | 2.208 | 0.166 | 0.041 |
| 15 | 2.368 | 2.726 | 2.693 | 0.358 | 0.325 |
| 16 | 5.238 | 6.041 | 5.932 | 0.803 | 0.694 |
| 17 | 1.093 | 1.262 | 1.248 | 0.169 | 0.155 |
| 18 | 1.826 | 2.132 | 2.118 | 0.306 | 0.292 |

TABLE 6

| | CONCENTRATION OF Mg IN SOLID SOLUTION STATE (AFTER ANODIC OXIDATION) (MASS %) | | | | | PRESENCE/ABSENCE OF STRIP-LIKE LINE PATTERNS IN CENTRAL PORTION OF CROSS-SECTIONAL SURFACE |
|---|---|---|---|---|---|---|
| TEST MATERIAL | CENTRAL PORTION | QUARTER PORTION | SUPERFICIAL PORTION | [(CENTRAL PORTION)-(QUARTER PORTION)] | [(CENTRAL PORTION)-(SUPERFICIAL PORTION)] | |
| 11 | 0.535 | 0.520 | 0.545 | 0.015 | 0.01 | ABSENT |
| 12 | 1.186 | 1.229 | 1.158 | 0.043 | 0.028 | ABSENT |
| 13 | 0.253 | 0.237 | 0.258 | 0.016 | 0.005 | ABSENT |
| 14 | 0.434 | 0.401 | 0.441 | 0.033 | 0.007 | ABSENT |
| 15 | 0.473 | 0.545 | 0.538 | 0.072 | 0.065 | PRESENT |
| 16 | 1.048 | 1.209 | 1.186 | 0.161 | 0.138 | PRESENT |
| 17 | 0.218 | 0.253 | 0.249 | 0.035 | 0.031 | PRESENT |
| 18 | 0.366 | 0.426 | 0.423 | 0.06 | 0.057 | PRESENT |

Regarding Test Materials 11-14, manufactured by using the ingots obtained by casting wherein the molten metal inside of a casting mold was stirred by stirring blades during casting, as shown in Table 3, the measurement results of the concentration of peritectic elements in solid state in the plate thickness direction of each of the samples prior to anodic oxidation were such that the concentration difference between in the central portion and in the quarter portion, and the concentration difference between in the central portion and in the superficial portion were both 0.04% or less. Moreover, as shown in Table 5, the measurement results of the concentration of Mg in solid state in the plate thickness direction of each of the samples prior to anodic oxidation were such that the concentration difference between in the central portion and in the quarter portion, and the concentration difference between in the central portion and in the superficial portion were both 0.4% or less.

Test Materials 11-14, as shown in Tables 4 and 6, did not have strip-like line patterns in the central portions of the plate thickness of the cross-sectional surfaces after anodic oxidation, but alternatively had excellent surface quality.

Furthermore, regarding Test Materials 11-14, as shown in Table 4, the measurement results of the concentration of peritectic elements in solid state in the plate thickness direction of each of the samples after anodic oxidation were such that the concentration difference between in the central portion and in the quarter portion, and the concentration difference between in the central portion and in the superficial portion were both 0.02% or less. Moreover, as shown in Table 6, the measurement results of the concentration of Mg in the solid state in the plate thickness direction of each of the samples after anodic oxidation were such that the concentration difference between in the central portion and in the quarter portion, and the concentration difference between in the central portion and in the superficial portion were both 0.08% or less.

On the other hand, regarding Test Materials 15-18, manufactured by using the ingots obtained by casting wherein the molten metal inside of a casting mold was not stirred during casting, but alternatively cast according to a conventional method. As shown in Tables 3 and 5, Test Materials 15-18 did not satisfy at least one of the conditions: in one of which the measurement results of the concentration of peritectic elements in solid state in the plate thickness direction of each of the samples prior to anodic oxidation were such that the concentration difference between in the central portion and in the quarter portion, and the concentration difference between in the central portion and in the superficial portion were 0.04% or less; and in another of which the measurement results of the concentration of Mg in solid state in the plate thickness direction of each of the samples prior to anodic oxidation were such that the concentration difference between in the central portion and in the quarter portion, and the concentration difference between in the central portion and in the superficial portion were 0.4% or less.

In Test Materials 15-18, as shown in Tables 4 and 6, strip-like line patterns were produced in the central portion of the plate thickness in the cross-sectional surfaces after anodic oxidation, and the surface quality thereof was low.

Moreover, among Test Materials 15-18, as shown in Table 4, the measurement results of the concentration of peritectic elements in solid state in the plate thickness direction of each of the samples after anodic oxidation were such that the concentration difference between in the central portion and in the quarter portion, and the concentration difference between in the central portion and in the superficial portion both exceeded 0.02% in some of the materials. In addition, as shown in Table 6, the measurement results of the concentration of Mg in solid state in the plate thickness direction of each of the samples after anodic oxidation were such that the concentration difference between in the central portion and in the quarter portion, and the concentration difference between in the central portion and in the superficial portion both exceeded 0.08% in some of the materials.

Embodiment 1 and Comparative Example 1 substantiate the effect with respect to the cross-sectional surfaces perpendicular to the rolling direction. Similar tests and evaluations were conducted with respect to the cross-sectional surfaces parallel to the rolling direction, as a result of which similar results were achieved.

Embodiment 2, Comparative Example 2

Aluminum alloys, having compositions shown in Table 7, were cast by way of DC casting so as to make ingots with cross-sectional dimensions of 500 mm in thickness and 1500 mm in width. It is to be noted that casting was conducted under two different conditions: in one of which molten metal inside of a casting mold was stirred by using stirring blades during the casting; and in another of which no stirring was conducted.

Each of the obtained ingots was homogenized at the temperature of 525° C. for 12 hours and then cooled down to a room temperature. The portions of the ingots, corresponding to the top, bottom, and side surfaces for rolling, were respectively milled 20 mm, then reheated up to 480° C. so as to initiate hot rolling, and rolled so as to be 6.0 mm thick. End temperature of the hot rolling was set to 300° C. Subsequently, cold rolling was conducted so that the ingot became 3.0 mm thick, and softening treatment was conducted at the temperature of 360° C. for one hour. The alloy compositions, the casting conditions, and tensile strength in a direction parallel to the rolling direction regarding the obtained aluminum alloy plates (test materials) are shown in Table 8. Since cracks were produced in Test Material 5 in the hot rolling process, cold rolling and the following processes could not be conducted.

A sample with 20 mm width was cut out from the central portion of the width of each test material obtained as above and treated by resin embedding and grinding so as to reveal the cross-sectional surfaces in a direction perpendicular to the rolling direction. By using EPMA, concentration of peritectic elements in solid solution state (concentration of Ti solid solution+concentration of Cr solid solution) and concentration of Mg in solid solution state in the central portion, the quarter portion, and the superficial portion of the plate thickness were measured. The results are respectively shown in Tables 9 and 11.

A sample with 400 mm width and 50 mm length was cut out from the central portion of the width of each aluminum alloy plate obtained as above. The sample was treated such that end surfaces thereof were cut by a milling cutter, and cross-sectional surfaces in a direction perpendicular to the rolling direction were roughened by shot blasting. Subsequently, chemical grinding by phosphoric acid and sulfuric acid was conducted, and anodic oxidation by sulfuric acid solution was conducted so as to form an anodic oxide coating with 10 μm thickness on the cross-sectional surfaces.

The anodically-oxidized materials obtained as above were visually checked whether strip-like line patterns were present or absent (presence or absence of production of the patterns) in the central portion of the plate thickness of the cross-sectional surfaces. Moreover, regarding the anodically-oxidized materials obtained as above, concentration of peritectic elements in solid solution state (concentration of Ti solid solution+concentration of Cr solid solution) and concentration of Mg in solid solution state in the central portion, the quarter portion, and the superficial portion of the plate thickness of the cross-sectional surfaces were obtained. The results are respectively shown in Tables 10 and 12.

TABLE 7

| ALLOY | CHEMICAL COMPOSITION (MASS %) | | | | | | | | |
|---|---|---|---|---|---|---|---|---|---|
| | Si | Fe | Cu | Mn | Mg | Cr | Zn | Ti | Al |
| V | 0.03 | 0.06 | 0.48 | 0.01 | 1.09 | 0.001 | 0.01 | 0.001 | Bal. |
| VI | 0.16 | 0.28 | 0.04 | 0.13 | 3.22 | 0.002 | 0.02 | 0.002 | Bal. |
| VII | 0.28 | 0.39 | 0.10 | 0.48 | 5.95 | 0.001 | 0.09 | 0.002 | Bal. |
| VII | 0.09 | 0.16 | 0.05 | 0.06 | 0.86 | 0.001 | 0.03 | 0.002 | Bal. |
| IX | 0.24 | 0.35 | 0.06 | 0.23 | 6.27 | 0.002 | 0.02 | 0.001 | Bal. |

TABLE 8

| | TEST MATERIAL | ALLOY | WITH/WITHOUT STIRRING OF MOLTEN METAL INSIDE CASTING MOLD | TENSILE STRENGTH (MPa) |
|---|---|---|---|---|
| INVENTION | 21 | V | WITH | 130 |
| | 22 | VI | WITH | 220 |
| | 23 | VII | WITH | 320 |
| COMPARISON | 24 | VIII | WITH | 115 |
| | 25 | IX | WITH | CRACKS PRODUCED IN HOT ROLLING PROCESS |
| | 26 | V | WITHOUT | 130 |
| | 27 | VI | WITHOUT | 225 |
| | 28 | VII | WITHOUT | 320 |

TABLE 9

| | CONCENTRATION OF PERITECTIC ELEMENTS IN SOLID SOLUTION STATE (BEFORE ANODIC OXIDATION) (MASS %) | | | | |
|---|---|---|---|---|---|
| TEST MATERIAL | CENTRAL PORTION | QUARTER PORTION | SUPERFICIAL PORTION | \|(CENTRAL PORTION) − (QUARTER PORTION)\| | \|(CENTRAL PORTION) − (SUPERFICIAL PORTION)\| |
| 21 | 0.002 | 0.002 | 0.002 | 0.000 | 0.000 |
| 22 | 0.004 | 0.004 | 0.004 | 0.000 | 0.000 |
| 23 | 0.003 | 0.003 | 0.003 | 0.000 | 0.000 |
| 26 | 0.001 | 0.002 | 0.002 | 0.001 | 0.001 |
| 27 | 0.002 | 0.004 | 0.004 | 0.002 | 0.002 |
| 28 | 0.002 | 0.003 | 0.003 | 0.001 | 0.001 |

TABLE 10

| TEST MATERIAL | CONCENTRATION OF PERITECTIC ELEMENTS IN SOLID SOLUTION STATE (AFTER ANODIC OXIDATION) (MASS %) | | | | | PRESENCE/ABSENCE OF STRIP-LIKE LINE PATTERNS IN CENTRAL PORTION OF CROSS-SECTIONAL SURFACE |
|---|---|---|---|---|---|---|
| | CENTRAL PORTION | QUARTER PORTION | SUPERFICIAL PORTION | [(CENTRAL PORTION)-(QUARTER PORTION)] | [(CENTRAL PORTION)-(SUPERFICIAL PORTION)] | |
| 21 | 0.001 | 0.001 | 0.001 | 0.000 | 0.000 | ABSENT |
| 22 | 0.002 | 0.002 | 0.002 | 0.000 | 0.000 | ABSENT |
| 23 | 0.002 | 0.002 | 0.002 | 0.002 | 0.001 | ABSENT |
| 26 | 0.001 | 0.001 | 0.001 | 0.000 | 0.000 | PRESENT |
| 27 | 0.001 | 0.002 | 0.002 | 0.001 | 0.001 | PRESENT |
| 28 | 0.001 | 0.002 | 0.002 | 0.001 | 0.001 | PRESENT |

TABLE 11

| TEST MATERIAL | CONCENTRATION OF Mg IN SOLID SOLUTION STATE (BEFORE ANODIC OXIDATION) (MASS %) | | | | |
|---|---|---|---|---|---|
| | CENTRAL PORTION | QUARTER PORTION | SUPERFICIAL PORTION | |(CENTRAL PORTION) − (QUARTER PORTION)| | |(CENTRAL PORTION) − (SUPERFICIAL PORTION)| |
| 21 | 1.10 | 1.08 | 1.12 | 0.02 | 0.02 |
| 22 | 3.19 | 3.25 | 3.30 | 0.06 | 0.11 |
| 23 | 5.32 | 5.69 | 5.67 | 0.37 | 0.35 |
| 26 | 0.78 | 1.20 | 1.19 | 0.42 | 0.41 |
| 27 | 2.74 | 3.35 | 3.24 | 0.61 | 0.50 |
| 28 | 4.81 | 5.78 | 5.68 | 0.97 | 0.87 |

TABLE 12

| TEST MATERIAL | CONCENTRATION OF Mg IN SOLID SOLUTION STATE (AFTER ANODIC OXIDATION) (MASS %) | | | | | PRESENCE/ABSENCE OF STRIP-LIKE LINE PATTERNS IN CENTRAL PORTION OF CROSS-SECTIONAL SURFACE |
|---|---|---|---|---|---|---|
| | CENTRAL PORTION | QUARTER PORTION | SUPERFICIAL PORTION | [(CENTRAL PORTION)-(QUARTER PORTION)] | [(CENTRAL PORTION)-(SUPERFICIAL PORTION)] | |
| 21 | 0.22 | 0.21 | 0.23 | 0.01 | 0.01 | ABSENT |
| 22 | 0.64 | 0.65 | 0.66 | 0.01 | 0.02 | ABSENT |
| 23 | 1.06 | 1.13 | 1.12 | 0.07 | 0.06 | ABSENT |
| 26 | 0.15 | 0.24 | 0.24 | 0.09 | 0.09 | PRESENT |
| 27 | 0.55 | 0.67 | 0.65 | 0.12 | 0.10 | PRESENT |
| 28 | 0.97 | 1.16 | 1.14 | 0.19 | 0.17 | PRESENT |

Regarding Test materials 21-23, manufactured by using the ingots obtained by casting wherein the molten metal inside of a casting mold was stirred by stirring blades during casting, as shown in Table 9, the measurement results of the concentration of peritectic elements in solid state in the plate thickness direction of each of the samples prior to anodic oxidation were such that the concentration difference between in the central portion and in the quarter portion, and the concentration difference between in the central portion and in the superficial portion were both 0.04% or less. Moreover, as shown in Table 11, the measurement results of the concentration of Mg in solid state contained in the plate thickness direction in each of the samples prior to anodic oxidation were such that the concentration difference between in the central portion and in the quarter portion, and the concentration difference between in the central portion and in the superficial portion were both 0.4% or less.

Test Materials 21-23, as shown in Tables 10 and 12, did not have strip-like line patterns in the central portions of the plate thickness of the cross-sectional surfaces after anodic oxidation, but alternatively had excellent surface quality.

Furthermore, regarding Test Materials 21-23, as shown in Table 10, the measurement results of the concentration of peritectic elements in solid state in the plate thickness direction of each of the samples after anodic oxidation were such that the concentration difference between in the central portion and in the quarter portion, and the concentration difference between in the central portion and in the superficial portion were both 0.02% or less. Moreover, as shown in Table 12, the measurement results of the concentration of Mg in solid state in the plate thickness direction of each of the samples after anodic oxidation were such that the concentration difference between in the central portion and in the quarter portion, and the concentration difference between in the central portion and in the superficial portion were both 0.08% or less.

Test Materials 24 and 25 have composition ranges that are not within the composition range according to one of the aspects of the present invention. As shown in Table 8, Test Material 24 does not satisfy the necessary tension strength 125 Mpa or more, which is required of aluminum alloy plates so as to be used as interior parts for automobiles or outer panels of home electric appliances. Moreover, since the additive amount of Mg contained in Test Material 25 exceeds 6%, cracks were produced in the hot rolling process.

Therefore, no evaluation was made in Table 9 and following tables regarding Test Materials 24 and 25.

Test Materials 26-28 have composition ranges that are within the composition range according to one of the aspects of the present invention, and are manufacture by casting according to a conventional method without stirring molten metal inside of a casting mold during casting. However, as shown in Tables 9 and 11, these materials did not satisfy at least one of the conditions: in one of which the measurement results of the concentration of peritectic elements in solid state in the plate thickness direction in the samples prior to anodic oxidation were such that the concentration difference between in the central portion and in the quarter portion, and the concentration difference between in the central portion and in the superficial portion were 0.04% or less; and in another of which the measurement results of the concentration of Mg in solid state in the plate thickness direction in the samples prior to anodic oxidation were such that the concentration difference between in the central portion and in the quarter portion, and the concentration difference between in the central portion and in the superficial portion were 0.4% or less.

In Test Materials 21-23, as shown in Tables 10 and 12, strip-like line patterns were produced in the central portion of the plate thickness in the cross-sectional surfaces after anodic oxidation, and the surface quality thereof was low.

Moreover, among Test Materials 26-28, as shown in Table 10, the measurement results of the concentration of peritectic elements in solid state in the plate thickness direction of each of the samples after anodic oxidation were such that the concentration difference between in the central portion and in the quarter portion, and the concentration difference between in the central portion and in the superficial portion both did not exceed 0.02% in some of the materials. However, as shown in Table 12, the measurement results of the concentration of Mg in solid state in the plate thickness direction of each of the samples after anodic oxidation were such that the concentration difference between in the central portion and in the quarter portion, and the concentration difference between in the central portion and in the superficial portion both exceeded 0.08% in some of the materials.

Embodiment 2 and Comparative Example 2 substantiate the effect with respect to the cross-sectional surfaces perpendicular to the rolling direction. Similar tests and evaluations were conducted with respect to the cross-sectional surfaces parallel to the rolling direction, as a result of which similar results were achieved.

The invention claimed is:

1. An aluminum alloy plate on which an anodically-oxidized coating is to be formed at least on a cross-sectional surface of the plate, which is a cross-sectional portion in a plate thickness direction, the plate comprising:
   0.001 mass %-0.1 mass % of Ti;
   0.0001 mass %-0.4 mass % of Cr;
   1.0 mass %-6.0 mass % of Mg; and
   0.005 mass %-0.09 mass % of Zn;
   wherein a remainder of the plate is made substantially of Al and inevitable impurities,
   wherein the Ti and Cr compose a peritectic element portion in solid solution state,
   wherein the plate thickness is represented as t (mm), a range within ±0.01×t (mm) from t/2 is represented as a central portion, a range within +0.01×t (mm) from t/4 is represented as a quarter portion, and a range within 0.02×t (mm) from a top surface in the plate thickness direction is represented as a superficial portion,
   wherein a concentration of a total amount of Ti and Cr in solid solution state in the plate thickness direction of the aluminum alloy plate is such that a concentration difference between the central portion and the quarter portion, and a concentration difference between the central portion and the superficial portion are each 0.04% (mass %) or less,
   wherein a concentration of Mg in solid solution state in the plate thickness direction of the plate is such that a concentration difference between the central portion and the quarter portion, and a concentration difference between the central portion and the superficial portion are each 0.4% or less, and
   wherein the concentration differences are defined as absolute values.

2. The aluminum alloy plate according to claim 1 comprising one, two, or more kinds of elements selected from 0.5 mass % or less of Cu, 0.5 mass % or less of Mn, 0.4 mass % or less of Fe and 0.3 mass % or less of Si, in addition to the Ti, the Cr and the Mg.

3. The aluminum alloy plate according to claim 1 wherein the plate thickness of the aluminum alloy plate is 0.3 mm or larger.

4. The aluminum alloy plate according to claim 1 wherein the plate comprises;
   0.002 mass % of Ti;
   0.001 mass %-0.002 mass % of Cr;
   3.22 mass %-5.95 mass % of Mg;
   0.04 mass %-0.10 mass % of Cu;
   0.13 mass %-0.48 mass % of Mn;
   0.28 mass %-0.39 mass % of Fe;
   0.16 mass %-0.26 mass % of Si; and
   0.02 mass %-0.09 mass % of Zn.

5. The aluminum alloy plate according to claim 1 wherein the plate comprises;
   3.22 mass %-5.95 mass % of Mg;
   0.04 mass %-0.10 mass % of Cu;
   0.13 mass %-0.48 mass % of Mn;
   0.28 mass %-0.39 mass % of Fe;
   0.16 mass %-0.26 mass % of Si and
   0.02 mass %-0.09 mass % of Zn.

6. An aluminum alloy plate on which an anodically-oxidized coating is to be formed at least on a cross-sectional surface of the plate, which is a cross-sectional portion in a plate thickness direction, the plate comprising:
   0.001 mass %-0.1 mass % of Ti;
   0.0001 mass %-0.4 mass % of Cr;
   1.0 mass %-6.0 mass % of Mg; and
   0.005 mass %-0.09 mass % of Zn;
   wherein a remainder of the plate is made substantially of Al and inevitable impurities,
   wherein the Ti and Cr compose a peritectic element portion in solid solution state,
   wherein the plate is created from an ingot cast in a stirred casting mold;
   wherein the plate thickness is represented as t (mm), a range within ±0.01×t (mm) from t/2 is represented as a central portion, a range within ±0.01×t (mm) from t/4 is represented as a quarter portion, and a range within 0.02×t (mm) from a top surface in the plate thickness direction is represented as a superficial portion,
   wherein a concentration of a total amount of Ti and Cr in solid solution state in the plate thickness direction of the aluminum alloy plate is such that a concentration difference between the central portion and the quarter portion, and a concentration difference between the central portion and the superficial portion are each 0.04% (mass %) or less, and wherein a concentration of Mg in solid solution state in the plate thickness direction of the plate is such that a concentration difference between the central portion and the quarter portion, and a concentration difference between the central portion and the superficial portion are each 0.4% or less, and wherein the concentration differences are defined as absolute values.

* * * * *